US010778195B2

United States Patent
Gokan

(10) Patent No.: US 10,778,195 B2
(45) Date of Patent: Sep. 15, 2020

(54) GATE DRIVE CIRCUIT AND GATE DRIVE SYSTEM

(71) Applicant: Mitsubishi Electric Corporation, Tokyo (JP)

(72) Inventor: Hiroshi Gokan, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/744,791

(22) Filed: Jan. 16, 2020

(65) Prior Publication Data

US 2020/0235722 A1  Jul. 23, 2020

(30) Foreign Application Priority Data

Jan. 23, 2019  (JP) .................................. 2019-009297

(51) Int. Cl.
   *H03K 3/01* (2006.01)
   *H03K 17/00* (2006.01)
   *H03K 17/0812* (2006.01)

(52) U.S. Cl.
   CPC ............... *H03K 3/01* (2013.01); *H03K 17/00* (2013.01); *H03K 17/0812* (2013.01)

(58) Field of Classification Search
   CPC ......... H03K 17/00; H03K 17/082; H03K 3/01
   See application file for complete search history.

(56) References Cited

U.S. PATENT DOCUMENTS

| 7,015,721 B2 * | 3/2006 | Nguyen | H03K 17/166 326/83 |
|---|---|---|---|
| 7,622,820 B1 * | 11/2009 | Prodic | H02M 3/158 307/31 |
| 2019/0056131 A1 * | 2/2019 | Warren | F24F 11/89 |

FOREIGN PATENT DOCUMENTS

| JP | 6176139 B2 | 8/2017 |
|---|---|---|
| JP | 6337803 B2 | 6/2018 |

OTHER PUBLICATIONS

Akimasa Niwa et al., "Dead Time Control Circuit using the Current Sensor of SiC-MOSFET", IEEJ Transactions on Industry Applications, 2016, pp. 145-151, vol. 136, No. 2.
University of Tsukuba, "Chapter 6 Construction of Control Circuit toward Further Reduction in Dead Time", 2017, 12102 Armor No. 8038.

* cited by examiner

*Primary Examiner* — Dinh T Le
(74) *Attorney, Agent, or Firm* — Sughrue Mion, PLLC; Richard C. Turner

(57) ABSTRACT

Provided is a gate drive circuit and a gate drive system, with which current unevenness among power devices connected in parallel can be reduced more. A gate drive circuit includes: an objective waveform generation unit configured to generate an objective waveform; a drive waveform generation unit configured to generate a drive waveform from the objective waveform, by referring to on-timing set information and off-timing set information; a drive control unit configured to drive the power device to turn the power device on/off, based on the drive waveform; a state detection unit configured to detect the state of the power device; a predicted waveform generation unit configured to generate a predicted waveform of a voltage; and an update unit configured to update the on-timing set information and the off-timing set information, based on the result of the state detection and the result of comparison to the predicted waveform.

11 Claims, 12 Drawing Sheets

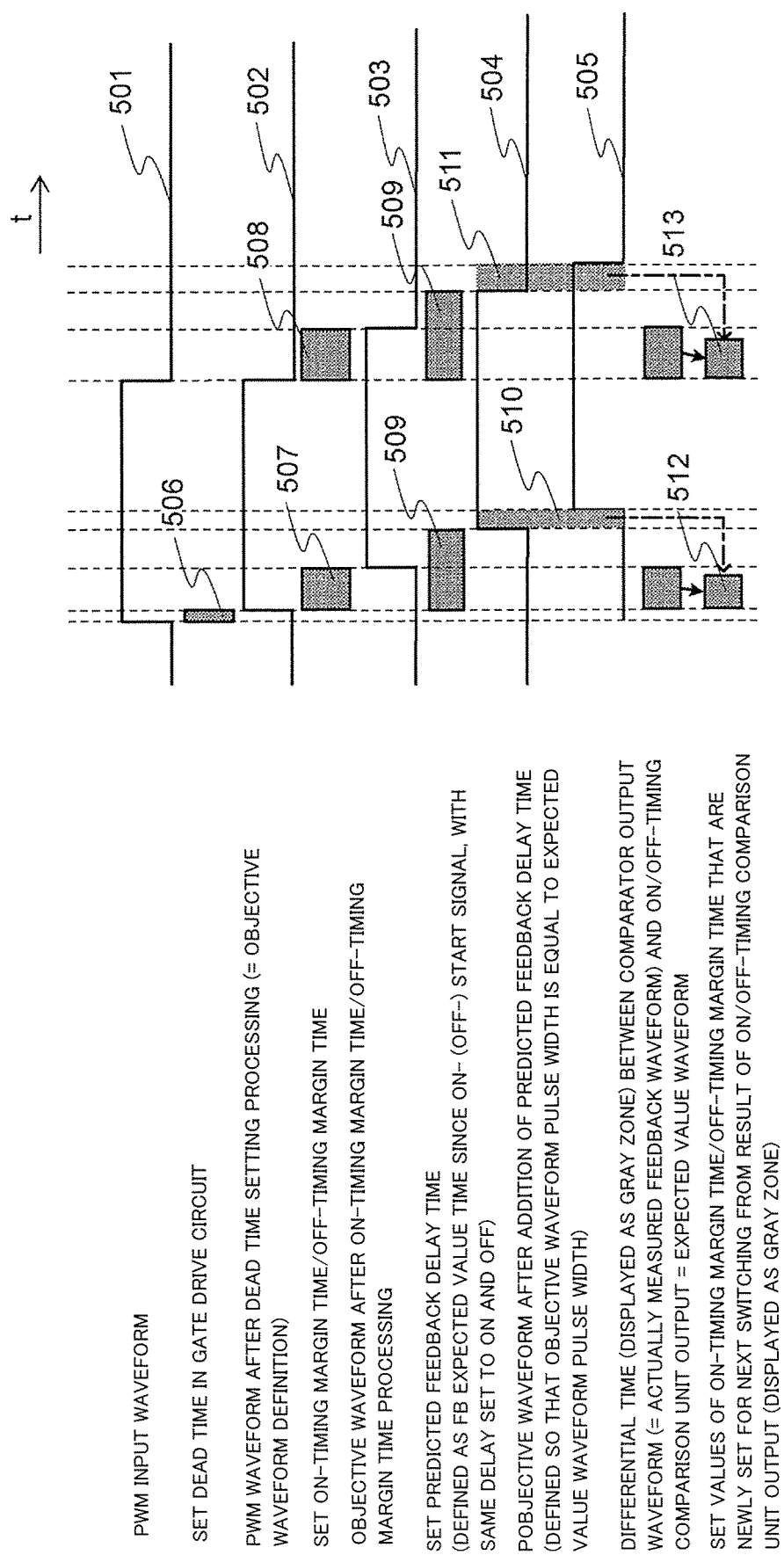

GATE DRIVE CIRCUIT AND GATE DRIVE SYSTEM

BACKGROUND OF THE INVENTION

1. Field of the Invention

The present invention relates to a gate drive circuit configured to drive a power device to turn the power device on/off, and a gate drive system.

2. Description of the Related Art

A margin is required to be secured for a dead time allowed for in the switching of a power device, for example, a metal oxide semiconductor field effect transistor (MOSFET) or an insulated gate bipolar transistor (IGBT), in order to avoid concurrently turning on power devices that are connected in series. For instance, a dead time of approximately 2 μsec. to 5 μsec. is required to be secured in a high-withstand-voltage power device run at a bus voltage of several hundred V or higher.

A pulse width modulation (PWM) period that is too short relative to the dead time cannot be set. High-frequency driving of a power device by PWM therefore has a limitation due to the dead time. As a method of shortening the dead time, one disclosed in Japanese Patent No. 6,337,803, for example, is known.

Silicon carbide (SiC), for example, is one of semiconductor materials used in a high-withstand-voltage power device. In a power device manufactured with the use of SiC, the selection of a small die size and a rise in the degree of parallelism by an adjustment of a current flowing therein are required in order to avoid the problem of locally concentrated heat generation and the problem of the residual defect density of a SiC substrate.

Examples of a configuration that may be employed when a plurality of power devices are connected in parallel include one in which all wiring lines including a bus bar are set to an equal length, and an equal parasitic LCR (inductor, capacitor, and resistor) is set to all configured lead frames or parasitic LCR values of the configured lead frames cancel one another in an equal manner. However, currents flowing in the power devices may still be uneven even when such a configuration is employed, depending on the operation timing of the respective power devices. Due to the current unevenness, that is, the concentration of a flowing current, the maximum allowable current of one power device is required to be large in proportion to the degree of parallelism. A power device die size to be employed is accordingly required to be large in proportion to the degree of parallelism, which increases the cost.

The cost required for a power device may be kept low by deciding on a maximum allowable current that is relatively small. This, however, gives rise to another problem in that the life of the power device is shortened due to the residual defect density of the SiC substrate when a large current flows because of the current unevenness. A short power device life may cause the life of a product, in which the power device is installed, to be short.

SUMMARY OF THE INVENTION

The present invention has been made to solve those problems, and an object of the present invention is therefore to provide a gate drive circuit and a gate drive system, with which current unevenness among power devices connected in parallel can be reduced more.

A gate drive circuit according to one embodiment of the present invention includes: an objective waveform generation unit configured to generate an objective waveform to which a dead time indicated by preset dead time information is added, so as to perform on/off driving of one or more power devices; a drive waveform generation unit configured to generate, from the objective waveform, a drive waveform for driving the one or more power devices, by referring to on-timing set information and off-timing set information, the on-timing set information indicating a first change amount of timing at which the one or more power devices are to be turned on with the objective waveform as a reference, the off-timing set information indicating a second change amount of timing at which the one or more power devices are to be turned off with the objective waveform as a reference; a drive control unit configured to perform on/off driving of the one or more power devices, by changing a voltage to be applied to a gate of each of the one or more power devices, based on the drive waveform; a state detection unit configured to detect a state of each of the one or more power devices, based on a gate voltage of the one or more power devices; a predicted waveform generation unit configured to generate a predicted waveform of the voltage to be applied by the drive control unit to the one or more power devices, based on the drive waveform; and an update unit configured to update the on-timing set information and the off-timing set information, based on a result of the state detection by the state detection unit and a result of comparison to the predicted waveform.

A gate drive system according to one embodiment of the present invention includes a plurality of gate drive circuits described above, and the plurality of gate drive circuits each drive at least one of a plurality of power devices connected in parallel to turn the one or more power devices on/off.

According to the one embodiment of the present invention, current unevenness among power devices connected in parallel can be reduced more.

According to the one embodiment of the present invention, fluctuations in time from on-input to the completion of transition to on and in time from off-input to the completion of transition to off among all parallel power devices having relevant complementary phases in PWM input can be reduced with the PWM pulse width, irrespective of the characteristics of the power devices, so that the time from on-input to the completion of transition to on is the same in and common to the power devices, and that the time from off-input to the completion of transition to off is the same in and common to the power devices.

According to the one embodiment of the present invention, the switching dead time can be shortened in all power devices by reducing the current unevenness among the power devices and ensuring that the time from on-input to the completion of transition to on and the time from off-input to the completion of transition to off are each a common set time in all power devices.

BRIEF DESCRIPTION OF THE DRAWINGS

FIG. 6 is a timing chart for showing an example of the operation of parts of a drive unit in which a gate drive circuit according to the first embodiment of the present invention is installed.

FIG. 7 is a timing chart for showing transitions with time of a gate-source voltage, a drain-source voltage, and a drain-source current that are observed when a MOSFET used as a power device is turned on.

DESCRIPTION OF THE EMBODIMENTS

Figure 1:
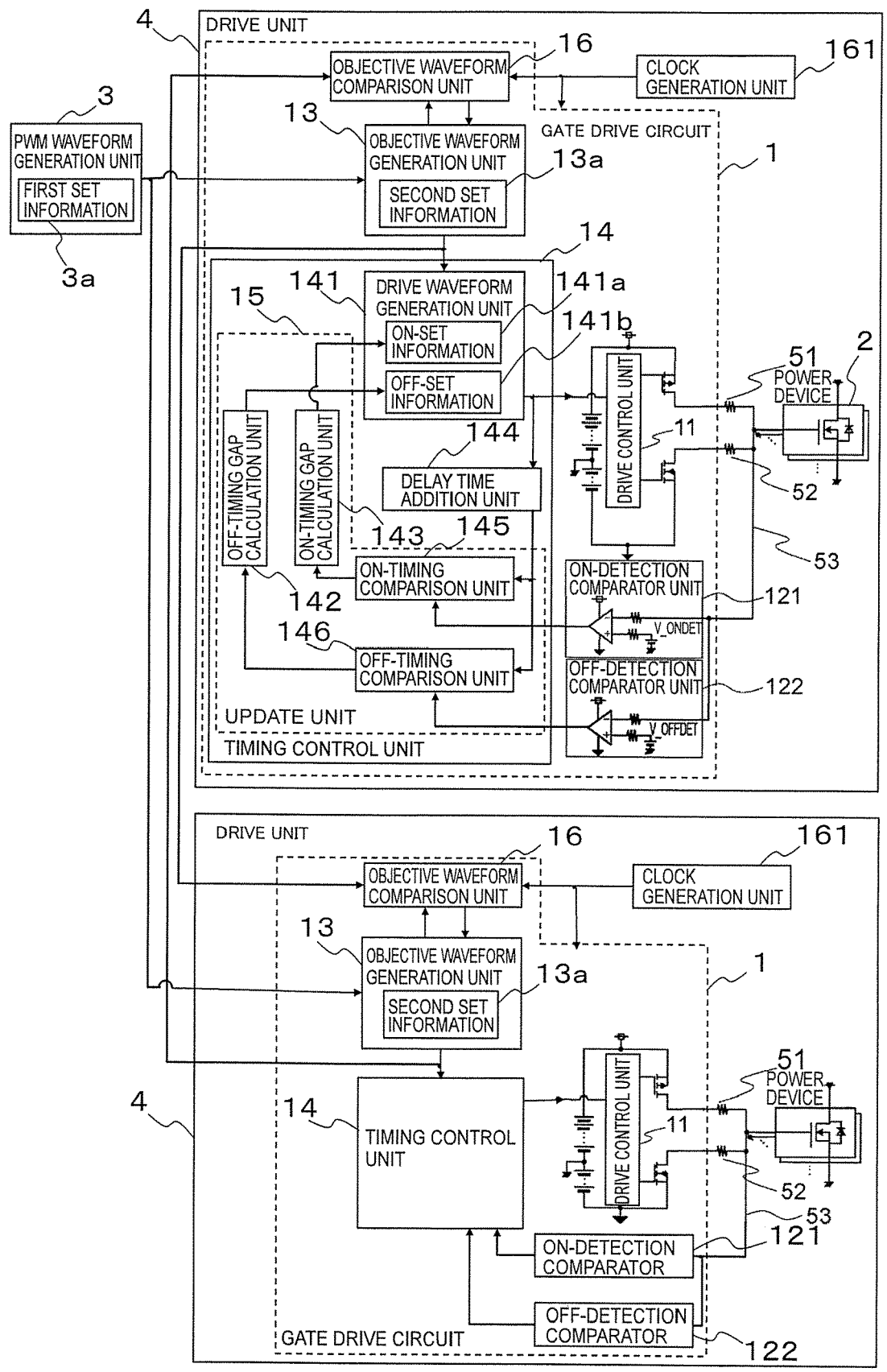
FIG. 1 is a diagram for illustrating an example of a configuration of a gate drive system according to a first embodiment of the present invention.

Embodiments of a gate drive circuit and gate drive system according to the present invention are described below with reference to the drawings. In the drawings, components that are the same as or correspond to each other are denoted by the same reference symbols.

First Embodiment

Figure 2:
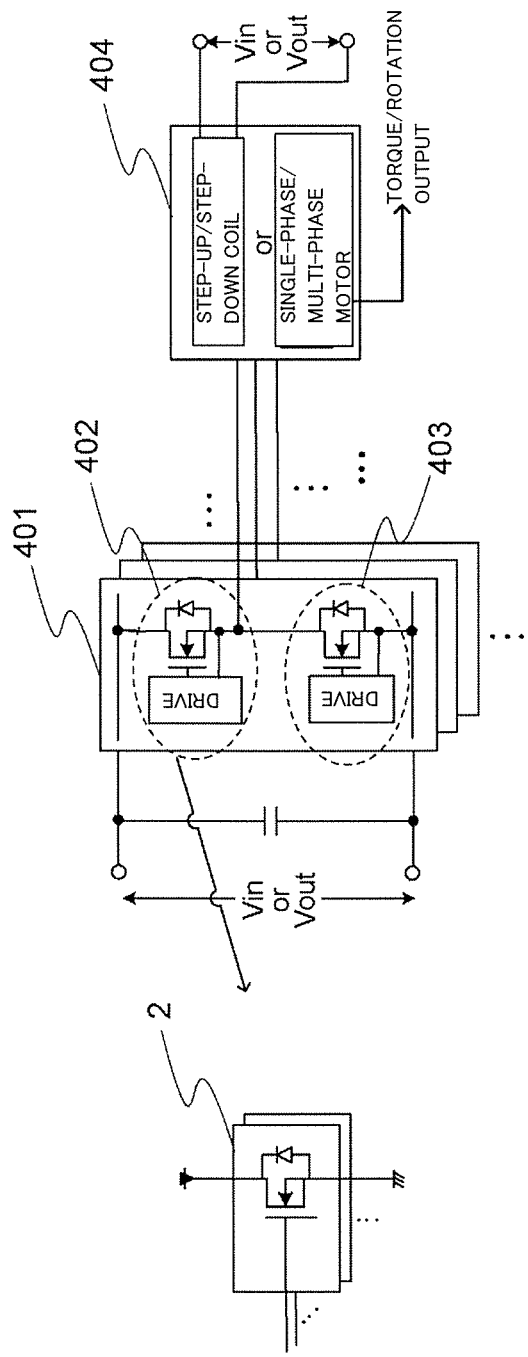
FIG. 2 is a diagram for illustrating an example of the use of power devices that are driven by the gate drive system according to the first embodiment of the present invention.

FIG. 1 is a diagram for illustrating an example of a configuration of agate drive system according to a first embodiment of the present invention. FIG. 2 is a diagram for illustrating an example of the use of power devices that are driven by the gate drive system according to the first embodiment of the present invention.

This gate drive system is for driving power devices 2 used as switching elements to turn the power devices 2 on/off. The power devices 2 to be driven are N-channel MOSFETs. More specifically, the power devices 2 are ones that use a wide-band gap semiconductor, for example, SiC or gallium nitride (GaN). The power devices 2 that use a wide-band gap semiconductor can be driven at as high a frequency as 50 KHz, or higher, even when the bus voltage is several hundred V.

Those power devices 2 are used as, for example, a switching element 402 of an upper arm and a switching element 403 of a lower arm, which form, as illustrated in FIG. 2, a half bridge 401 prepared for each phase in an inverter circuit. A load 404 to which electric power is supplied by this inverter circuit is, for example, a step-up/step-down coil, a single-phase motor, or a multi-phase motor. The power devices 2 may be any power devices used for switching, and may be ones for uses other than inverter circuits and the like.

In FIG. 1, two drive units 4 each driving a plurality of power devices 2, and a PWM waveform generation unit 3 are illustrated. The plurality of power devices 2 driven by each of the two drive units 4 are used as the same arm of the same phase. The plurality of power devices 2 are thus connected in parallel as the same arm of the same phase. For the sake of convenience, only portions of the gate drive system that are relevant to the driving of the same arm of the same phase are illustrated in FIG. 1.

In each of the drive units 4, a gate drive circuit 1 installed in the other drive unit 4 is equivalent to a first gate drive circuit. The power devices 2 driven by the other drive unit 4 are equivalent to first power devices. An objective waveform generation unit 13 installed in the other drive unit 4 is equivalent to a first objective waveform generation unit, and a PWM waveform generated by the first objective waveform generation unit is equivalent to a first objective waveform.

Even the power devices 2 of the same model number normally differ from one another in actual characteristics, specific examples of which include a threshold voltage Vth and a transconductance gm. When a plurality of such power devices 2 are connected in parallel, currents flowing in the respective power devices 2 tend to be uneven. A specific description on this current unevenness is given before details of the configuration of the gate drive system are described.

Figure 3:
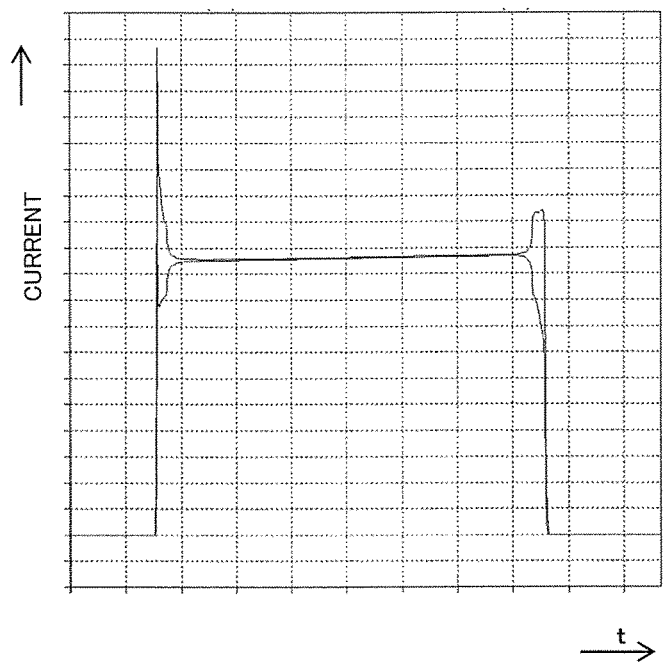
FIG. 3 is a graph for showing an example of changes with time of drain currents due to a difference in threshold voltage.
Figure 4A:
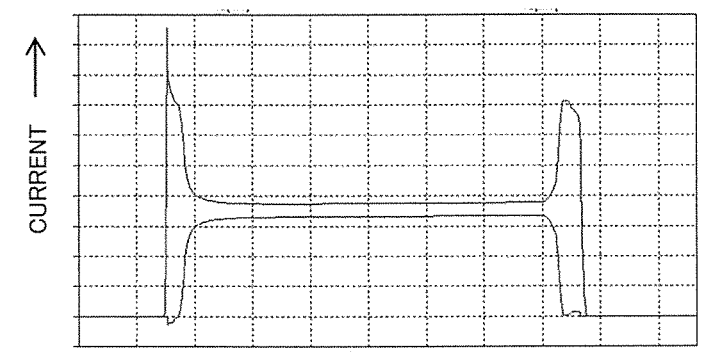
FIG. 4A and FIG. 4B are graphs for showing current unevenness that is caused by differences in threshold voltage and in transconductance.
Figure 4B:
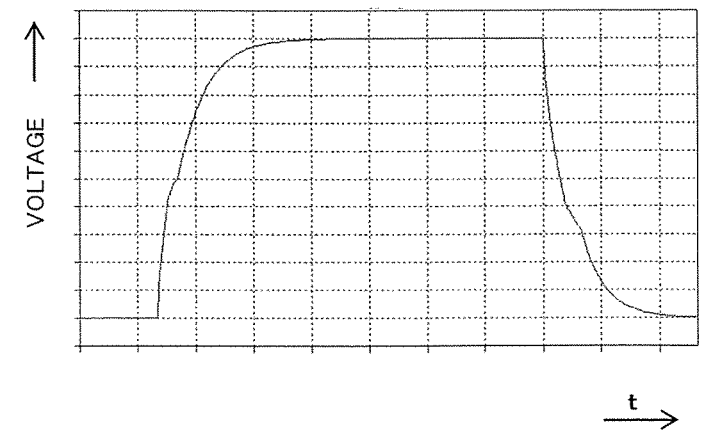

FIG. 3 is a graph for showing an example of changes with time of drain currents due to a difference in threshold voltage. FIG. 4A and FIG. 4B are graphs for showing current unevenness that is caused by differences in threshold voltage and in transconductance. FIG. 4A is a graph for showing an example of changes with time of drain currents ID, and FIG. 4B is a graph for showing an example of changes with time of gate voltages Vgs. A case of two power devices 2 is shown both in FIG. 3, and FIG. 4A and FIG. 4B. Time is represented by the horizontal axes both in FIG. 3, and FIG. 4A and FIG. 4B.

As shown in FIG. 3, and FIGS. 4A and 4B, fluctuations in characteristics cause a large drain current ID to flow in one of the power devices 2. A particularly large drain current ID flows when the power devices 2 are turned on, and a larger drain current ID flows in the power device 2 that is lower in threshold voltage Vth. The magnitude of a local drain current ID increases as the degree of parallelism becomes higher, that is, as the power devices 2 connected in parallel increase in number. The maximum allowable current of one power device 2 is therefore required to increase in proportion to the degree of parallelism. In view of this, voltage waveforms with which the power devices 2 are driven are manipulated to suit the actual characteristics in the first embodiment. Through this manipulation, the power devices 2 driven by each drive unit 4 are turned on at the same timing and turned off at the same timing to reduce current unevenness among the power devices 2 connected in parallel.

Figure 5A:
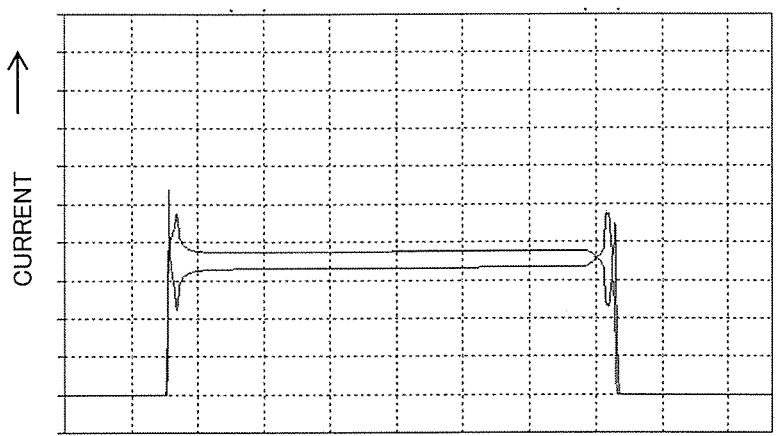
FIG. 5A and FIG. 5B are graphs for showing an example of current unevenness reduction that is accomplished by the gate drive system according to the first embodiment of the present invention.
Figure 5B:
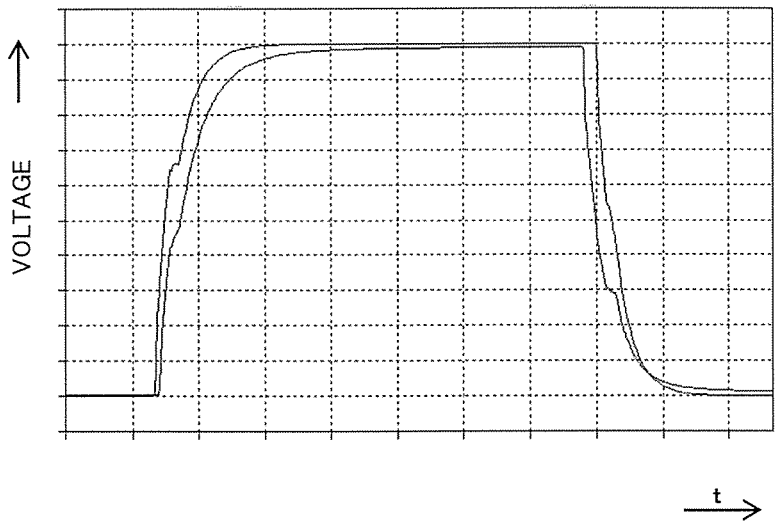

FIGS. 5A and 5B are graphs for showing an example of current unevenness reduction that is accomplished by the gate drive system according to the first embodiment of the present invention. FIG. 5A is a graph for showing an example of changes with time of the drain currents ID, and FIG. 5B is a graph for showing an example of changes with time of the gate voltages Vgs.

As shown in FIGS. 5A and 5B, current unevenness observed when the power devices 2 are turned on and when the power devices 2 are turned off can be reduced by manipulation performed on the waveforms of the gate voltages Vgs, with which the power devices 2 are driven, to suit the actual characteristics. The maximum allowable current required of the power devices 2 is accordingly smaller, with the result that the shortening of the life of the power devices 2 is prevented.

FIG. 6 is a timing chart for showing an example of the operation of parts of each drive unit in which the gate drive circuit according to the first embodiment of the present invention is installed. Returning to FIG. 1, the configuration and operation of each drive unit 4 are described with reference to FIG. 6.

As illustrated in FIG. 1, each drive unit 4 includes the gate drive circuit 1, an objective waveform comparison unit 16, and a clock generation unit 161. A gate of each power device 2 and the gate drive circuit 1 are connected via an on-side gate resistor 51 and an off-side gate resistor 52.

The PWM waveform generation unit 3 outputs a drive PWM waveform signal indicating a PWM waveform for driving to each drive unit 4 that drives the same arm of the same phase. First set information 3a, which indicates a set dead time, may be used to generate the drive PWM waveform signal. A PWM input waveform 501 illustrated in FIG. 6 is a waveform indicated by the drive PWM waveform signal.

The drive PWM waveform signal output from the PWM waveform generation unit 3 is input to the objective waveform generation unit 13. The objective waveform generation unit 13 delays the PWM input waveform 501 indicated by the drive PWM waveform signal in accordance with second set information 13a, which indicates a set dead time, to generate a PWM waveform that is the objective waveform. In FIG. 6, the dead time indicated by the second set information 13a is denoted by 506, and the objective PWM waveform generated by delaying the PWM input waveform 501 by the dead time 506 is denoted by 502. A PWM waveform signal indicating the PWM waveform 502 is output to a drive waveform generation unit 141. The second set information 13a corresponds to dead-time information in the first embodiment.

The drive waveform generation unit 141, an on-timing gap calculation unit 142, an off-timing gap calculation unit 143, a delay time addition unit 144, an on-timing comparison unit 145, and an off-timing comparison unit 146 are components of a timing control unit 14. The timing control unit 14 performs control for optimizing drive timing to drive the power devices 2, namely, timing to start voltage application to the gates and timing to end voltage application to the gates, through manipulation of PWM waveforms for driving the power devices 2. With this optimization, PWM waveforms that are voltage waveforms used to drive the power devices 2 are manipulated.

Of the components of the timing control unit 14, the on-timing gap calculation unit 142, the off-timing gap calculation unit 143, the on-timing comparison unit 145, and the off-timing comparison unit 146 form an update unit 15, which updates information for changing the drive timing to drive the power devices 2.

The drive waveform generation unit 141 generates, as a drive waveform, an objective PWM waveform 503 by delaying the rise and fall of the PWM waveform 502 in accordance with on-set information 141a, which indicates a margin time of on-timing, and off-set information 141b, which indicates a margin time of off-timing. An objective PWM waveform signal indicating the objective PWM waveform 503 is output to the drive control unit 11 and the delay time addition unit 144. In FIG. 6, the on-side margin time indicated by the on-set information 141a is denoted by 507, and the off-side margin time indicated by the off-set information 141b is denoted by 508. The on-set information 141a and the off-set information 141b correspond to on-timing set information and off-timing set information, respectively, in the first embodiment. The on-side margin time 507 is a predicted feedback delay time for feeding back a delay amount that is predicted on the on-side. The off-side margin time 508 is a predicted feedback delay time for feeding back a delay amount that is predicted on the off-side. In the first embodiment, the margin time indicated by the on-set information 141a and the margin time indicated by the off-set information 141b correspond to "first change amount" and "second change amount", respectively.

The drive control unit 11 uses the objective PWM waveform signal input thereto to drive two MOSFETs that form a half bridge, to thereby apply a voltage to the gate of each power device 2. With this voltage application, each power device 2 is driven as indicated by the objective PWM waveform signal.

There is a time lag between the output of the objective PWM waveform signal from the drive waveform generation unit 141 and the actual voltage application to the gate of the power device 2 by the drive control unit 11 in accordance with the objective PWM waveform signal. The delay time addition unit 144 generates an expected value waveform 504, which is a PWM waveform obtained by delaying the objective PWM waveform signal by a predicted time lag. On-timing information indicating timing at which the rise of the expected value waveform 504 begins is output to the on-timing comparison unit 145. Off-timing information indicating timing at which the fall of the expected value waveform 504 is completed is output to the off-timing comparison unit 146.

Quadrangles 509 illustrated in FIG. 6 each represent one of a time obtained by adding a delay that is a time lag predicted on the on-side to the on-side margin time 507, and a time obtained by adding a delay that is a time lag predicted on the off-side to the off-side margin time 508. The on-side delay and the off-side delay here are the same set time. A goal is to give an equal PWM waveform pulse width to the objective waveform. 503 and the expected value waveform 504 by setting the same set time as the on-side delay time 509 and the off-side delay time 509 in the expected value waveform 504, which is an objective waveform obtained by adding the predicted feedback delay time described above to the objective waveform 503.

The delay time addition unit 144 corresponds to a predicted waveform generation unit in the first embodiment. The expected value waveform 504 accordingly corresponds to a predicted waveform in the first embodiment.

The gate of each power device 2 is connected by wiring 53 to an on-detection comparator unit 121 and an off-detection comparator unit 122. The gate voltage Vgs of the power device 2 is therefore applied to the on-detection comparator unit 121 and the off-detection comparator unit 122 each. The on-detection comparator unit 121 and the off-detection comparator unit 122 both correspond to state detection parts in the first embodiment.

This gate voltage Vgs is applied via a resistor to an inverting input terminal of an operational amplifier that forms the on-detection comparator unit 121. A power source is connected to a non-inverting input terminal of the operational amplifier via a resistor. The resistor and the power source are for generating an on-side threshold voltage V_ONDET, to which the gate voltage Vgs is compared. Output from the on-detection comparator unit 121, namely, output from the operational amplifier, varies in polarity, depending on the magnitude relationship between the gate voltage Vgs and the on-side threshold voltage V_ONDET.

Also in the off-detection comparator unit 122, the gate voltage Vgs is applied via a resistor to an inverting input terminal of an operational amplifier that forms the off-detection comparator unit 122. A power source is connected to a non-inverting input terminal of the operational amplifier via a resistor. The resistor and the power source are for generating an off-side threshold voltage V_OFFDET, to which the gate voltage Vgs is compared. Output from the off-detection comparator unit 122, namely, output from the operational amplifier, also varies in polarity, depending on the magnitude relationship between the gate voltage Vgs and the off-side threshold voltage V_OFFDET.

Figure 7:
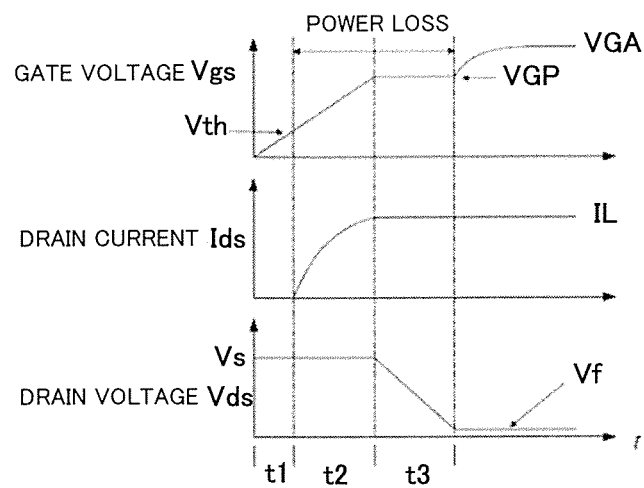
Figure 8:
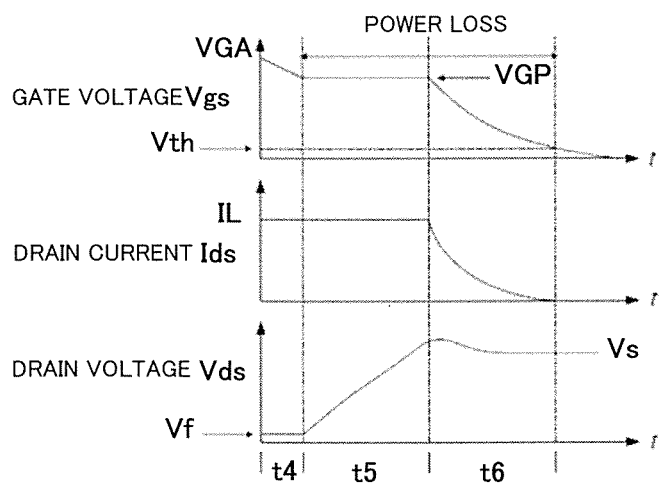
FIG. 8 is a timing chart for showing transitions with time of the gate-source voltage, the drain-source voltage, and the drain-source current that are observed when the MOSFET used as a power device is turned off.

FIG. 7 is a timing chart for showing transitions with time of a gate-source voltage, a drain-source voltage, and a drain-source current that are observed when a MOSFET used as a power device is turned on. FIG. 8 is a timing chart for showing transitions with time of the gate-source voltage, the drain-source voltage, and the drain-source current that are observed when the MOSFET used as a power device is turned off. A detailed description is given with reference to FIG. 7 and FIG. 8 on a relationship between the gate voltage Vgs, which is a gate-source voltage observed when a MOSFET usable as the power device 2 is turned on and turned off, and a switching state.

In FIG. 7 and FIG. 8, the drain-source voltage is denoted by Vds, a drain current between the drain and the source is denoted by Ids, a mirror section voltage is denoted by VGP, a maximum value of the gate voltage Vgs is denoted by VGA, an upper bus voltage and a lower bus voltage are denoted by Vs and Vf, respectively, and a maximum value of the drain current Ids that can flow in the MOSFET is denoted by IL. Here, the resistance value of the on-side gate resistor 51 is represented by Rg_on, the resistance value of the off-side gate resistor 52 is represented by Rg_off, a gate-source capacitance is represented by $C_{gs}$, and a gate-drain capacitance is represented by $C_{gd}$. A transconductance gm in this case is obtained as follows:

$$gm = dID/dVgs \quad (1)$$

The mirror section voltage VGP is obtained with the use of the transconductance gm by an expression given below.

$$VGP = Vth + ID/gm \quad (2)$$

Transition times t1 to t6 illustrated in FIG. 7 and FIG. 8 are obtained in a manner described below. The transition times t1 to t3 are periods in which the MOSFET is turned on, and t1 is a time from the start of application of the gate voltage Vgs until when the gate voltage Vgs exceeds the threshold voltage Vth, t2 is a time from when the gate voltage Vgs exceeds the threshold voltage Vth until when the gate voltage Vgs arrives at the mirror section voltage VGP, and t3 is the time of a mirror section. The transition times t4 to t6 are periods in which the MOSFET is turned off, and t4 is a time from the start of the turning off until when the gate voltage Vgs arrives at the mirror section voltage VGP, t5 is the time of a mirror section, and t6 is a time required for the gate voltage Vgs to drop to the threshold voltage Vth after the end of the mirror section.

$$t1 = Rg\_on(C_{gs} + C_{gd})\ln\left(\frac{1}{1 - \frac{Vth}{VGA}}\right) \quad (3)$$

$$t2 = Rg\_on(C_{gs} + C_{gd})\ln\left(\frac{gm\,(VGA - Vth)}{gm\,(VGA - Vth) - ID}\right) \quad (4)$$

$$t3 = \frac{Rg\_on\,C_{gd}(Vs - Vf)}{VGA - \left(Vth + \frac{ID}{gm}\right)} \quad (5)$$

$$t4 = Rg\_off(C_{gs} + C_{gd})\ln\left(\frac{VGA}{Vth + \frac{ID}{gm}}\right) \quad (6)$$

$$t5 = \frac{Rg\_off\,C_{gd}(Vs - Vf)}{Vth + \frac{ID}{gm}} \quad (7)$$

$$t6 = Rg\_off(C_{gs} + C_{gd})\ln\left(\frac{ID}{gm \cdot Vth} + 1\right) \quad (8)$$

Direct detection of the switching state of the MOSFET, namely, the power device 2, and the identification of the switching state are thus accomplished by monitoring the gate voltage Vgs. Output from the on-detection comparator unit 121 and output from the off-detection comparator unit 122 are therefore detection results that indicate the switching state of the power device 2 directly or indirectly. This is why the gate voltage Vgs is monitored with the use of the on-detection comparator unit 121 and the off-detection comparator unit 122 in the first embodiment.

The transition times t1 to t6 are affected by at least one of the threshold voltage Vth and the transconductance gm. The power devices 2 that are closer to one another in threshold voltage Vth and transconductance gm are therefore preferred as the power devices 2 that are driven by the same drive unit 4. This is because it is reasonable to drive the power devices 2 through shared wiring equal in length and having no common impedance when the power devices 2 are close to one another in the value of the threshold voltage Vth and the value of the transconductance gm. The number of drive units 4 may be increased or decreased to drive the power devices 2 that are closer to one another in threshold voltage Vth and transconductance gm. Actual measurement values are preferred to be used as the threshold voltage Vth and the transconductance gm in terms of control.

From Expression (1), the transconductance gm that is small means a long time required for the turning on. As is clear from Expression (2) to Expression (4), however, the turning on can be quickened by setting a smaller value as the on-side gate resistance value Rg_on, namely, the resistance value of the on-side gate resistor 51. Similarly, as is clear from Expression (4) to Expression (6), the turning off can be quickened by setting a smaller value as the off-side resistance value Rg_off, namely, the resistance value of the off-side gate resistor 52. It is therefore preferred to adjust the on-side gate resistance value Rg_on and the off-side gate resistance value Rg_off of each drive unit 4 to suit the characteristics of the power devices 2 to be driven, so that fluctuations in time required for the turning on and time required for the turning off are reduced among the drive units 4.

The mirror section voltage VGP is obtained by Expression (2) given above. In the power device 2 that is a MOSFET, the drain current ID starts to flow as the gate voltage Vgs exceeds the threshold voltage Vth, and stops flowing as the gate voltage Vgs drops lower than the threshold voltage Vth. The dead time can accordingly be managed by controlling timing at which the gate voltage Vgs matches the threshold voltage Vth.

In the switching of the power devices 2 that are connected in parallel, a current becomes uneven when one of the power devices 2 is turned on earlier than the other power devices 2 or is turned off later than the other power devices 2. The unevenness of the drain current ID is most prominent at the end of a mirror section and from then on in the turning on. Also in the turning off, the unevenness of the drain current ID is most prominent at the end of a mirror section and from then on, that is, within the transition time t6. The transition time t6 is actually very short and the current unevenness normally occurs in the transition time t6. It is therefore important to align the timing of completion of a mirror section in the turning on and that in the turning off in order to reduce current unevenness among the power devices 2.

For that reason, the mirror section voltage VGP is set to the on-side threshold voltage V_ONDET in the first embodiment. This ensures that the timing of the end of a mirror section is detected with high precision in the turning on. The polarity of a signal output from the on-detection comparator unit 121 changes from positive to negative as the gate voltage Vgs exceeds the on-side threshold voltage V_ONDET.

Similarly, the mirror section voltage VGP is set to the off-side threshold voltage V_OFFDET. This ensures that the timing of the end of a mirror section is detected with high precision in the turning off as well. The polarity of a signal output from the off-detection comparator unit 122 changes from negative to positive as the gate voltage Vgs drops below the off-side threshold voltage V_OFFDET.

The on-timing comparison unit 145 calculates the transition times t1 to t3. The on-timing comparison unit 145 uses the results of this calculation and timing at which the polarity of an output signal from the on-detection comparator unit 121 changes from positive to negative to identify timing at which the drive control unit 11 starts voltage application to the gates of the power devices 2. The on-timing comparison unit 145 then compares the identified timing to timing that is indicated by the on-timing information input from the delay time addition unit 144, and calculates a differential time that is a time lag between the former and the latter. The calculated differential time is notified to the on-timing gap calculation unit 142. In FIG. 6, this differential time is denoted by 510 and represented by a gray zone.

The off-timing comparison unit 146 calculates the transition time t6. The off-timing comparison unit 146 uses the result of this calculation and timing at which the polarity of an output signal from the off-detection comparator unit 122 changes from negative to positive to identify timing at which the drive control unit 11 ends voltage application to the gates of the power devices 2. The off-timing comparison unit 146 then compares the identified timing to timing that is indicated by the off-timing information input from the delay time addition unit 144, and calculates a differential time that is a time lag between the former and the latter. The calculated differential time is notified to the off-timing gap calculation unit 143. In FIG. 6, this differential time is denoted by 511 and represented by a gray zone. An actual drive waveform 505 of the power device 2 is estimated by identifying rise start timing and fall end timing.

The on-timing gap calculation unit 142 calculates, by calculation that uses the notified differential time, a time to be newly set as a margin time for on-timing, and sets information that indicates the calculated time as the on-set information 141*a*.

In the case illustrated in FIG. 6, the differential time is a positive value, which means that timing at which the drive control unit 11 actually starts voltage application is late. The on-timing gap calculation unit 142 therefore calculates, as a new margin time for on-timing, a time shorter than the time that is indicated by the current on-set information 141*a*, and updates the on-set information 141*a*. A quadrangle 512 illustrated in FIG. 6 represents the margin time for on-timing to be newly set, namely, the updated on-set information 141*a*.

The time indicated by the new on-set information 141*a* differs from the time indicated by the preceding on-set information 141*a* by an amount less than the differential time. This is for a gap to be gradually close to the optimum on-set information 141*a*. The actual settings, namely, update of the on-set information 141*a*, may be performed by the drive waveform generation unit 141. That is, the on-timing gap calculation unit 142 may calculate the on-set information 141*a* to be set, or an amount of change from the current on-set information, and make the result of the calculation accessible. When the on-set information 141*a* is to be updated by the drive waveform generation unit 141 itself, the drive waveform generation unit 141 is included in the update unit 15.

The off-timing gap calculation unit 143 calculates, by calculation that uses the notified differential time, a time to be newly set as a margin time for off-timing, and sets information that indicates the calculated time as the off-set information 141*b*.

In the case illustrated in FIG. 6, the differential time is a positive value, which means that timing at which the drive control unit 11 actually ends voltage application is late. The off-timing gap calculation unit 143 therefore calculates, as a new margin time for off-timing, a time shorter than the time that is indicated by the current off-set information 141*b*, and updates the off-set information 141*b*. A quadrangle 513 illustrated in FIG. 6 represents the margin time for off-timing to be newly set, namely, the updated off-set information 141*b*.

Similarly to the on-set information 141*a*, the time indicated by the new off-set information 141*b* differs from the time indicated by the preceding off-set information 141*b* by an amount less than the differential time. This is for a gap to be gradually close to the optimum off-set information 141*b*. The actual settings, namely, update of the off-set information 141*b*, may be performed by the drive waveform generation unit 141. That is, the off-timing gap calculation unit 143 may calculate the off-set information 141*b* to be set, or an amount of change from the current off-set information, and make the result of the calculation accessible.

In this manner, the on-set information 141*a* and the off-set information 141*b* come closer to their respective optimum values by repeating the driving of the power devices 2. This means that the drive units 4 driving the power devices 2 that are connected in parallel keep updating the on-set information 141*a* and the off-set information 141*b* so that turn-on timing is aligned between the drive units 4 and that turn-off timing is aligned between the drive units 4, based on the PWM waveform 502. Current unevenness among the power devices 2 that are driven by different drive units 4 is accordingly reduced, for example, from the one shown in FIGS. 4A and 4B to the one shown in FIG. 5.

Time management is executed based on a clock output from the clock generation unit 161. When the clock has a frequency of, for example, 200 MHz, time management is theoretically executable within a range of ±5 ns. In actuality, however, the drain current ID constantly changes. The on-timing and off-timing of the power devices 2 consequently fluctuate as the temperature, the bus voltage, and other factors change. Even when the fluctuations occur, a gap of drive timing to drive the power devices 2 can be controlled to be contained within several ten ns by optimizing the drain current ID, the gate resistance values Rg_on and Rg_off, and others by Expression (3) to Expression (8), and using representative values that are determined from actual measurement values as the threshold voltage Vth and the transconductance gm. In order to accomplish this control as well, the use of the mirror section voltage VGP as the on-side threshold voltage V_ONDET and the off-side threshold voltage V_OFFDET is preferred.

The objective waveform comparison unit 16 provided in each drive unit 4 receives a PWM waveform signal that is generated by the objective waveform generation unit 13 of the drive unit 4 in which the objective waveform comparison unit 16 is provided, and a PWM waveform signal that is generated by the objective waveform generation unit 13 of another drive unit 4, and compares the two. In other words, the objective waveform comparison unit 16 compares a PWM waveform signal that is generated by the gate drive circuit 1 in which the objective waveform comparison unit 16 is included to a PWM waveform signal that is generated by another gate drive circuit 1, which drives one power device 2 and at least one other power device 2 connected in parallel to the power device 2. From the result of the comparison, the objective waveform comparison unit 16 generates an objective PWM waveform signal that indicates a PWM waveform to be newly aimed for, or generates change amount information required for the generation of the objective PWM waveform signal. The objective PWM waveform signal is generated by, for example, extracting a period in which the two are both on, and generating a PWM waveform that turns the power devices 2 on only in the extracted period. The change amount information may indicate, for example, a differential time of the rise start timing and a differential time of the fall end timing.

The thus generated objective PWM waveform signal, or change amount information, is output to the objective waveform generation unit 13 in the same drive unit 4 to be used for the generation of a PWM waveform signal by the objective waveform generation unit 13. The objective waveform generation unit 13 uses this to change the PWM waveform signal to be generated, depending on the result of comparison by the objective waveform comparison unit 16. The influence of a gap due to a difference of objective PWM waveform signals that serve as a base among the drive units 4 is consequently avoided or prevented. As a result, a gap in the driving of the power devices 2 by the drive units 4 is also reduced, and current unevenness among the drive units 4 can be reduced even more.

Second Embodiment

Figure 9:
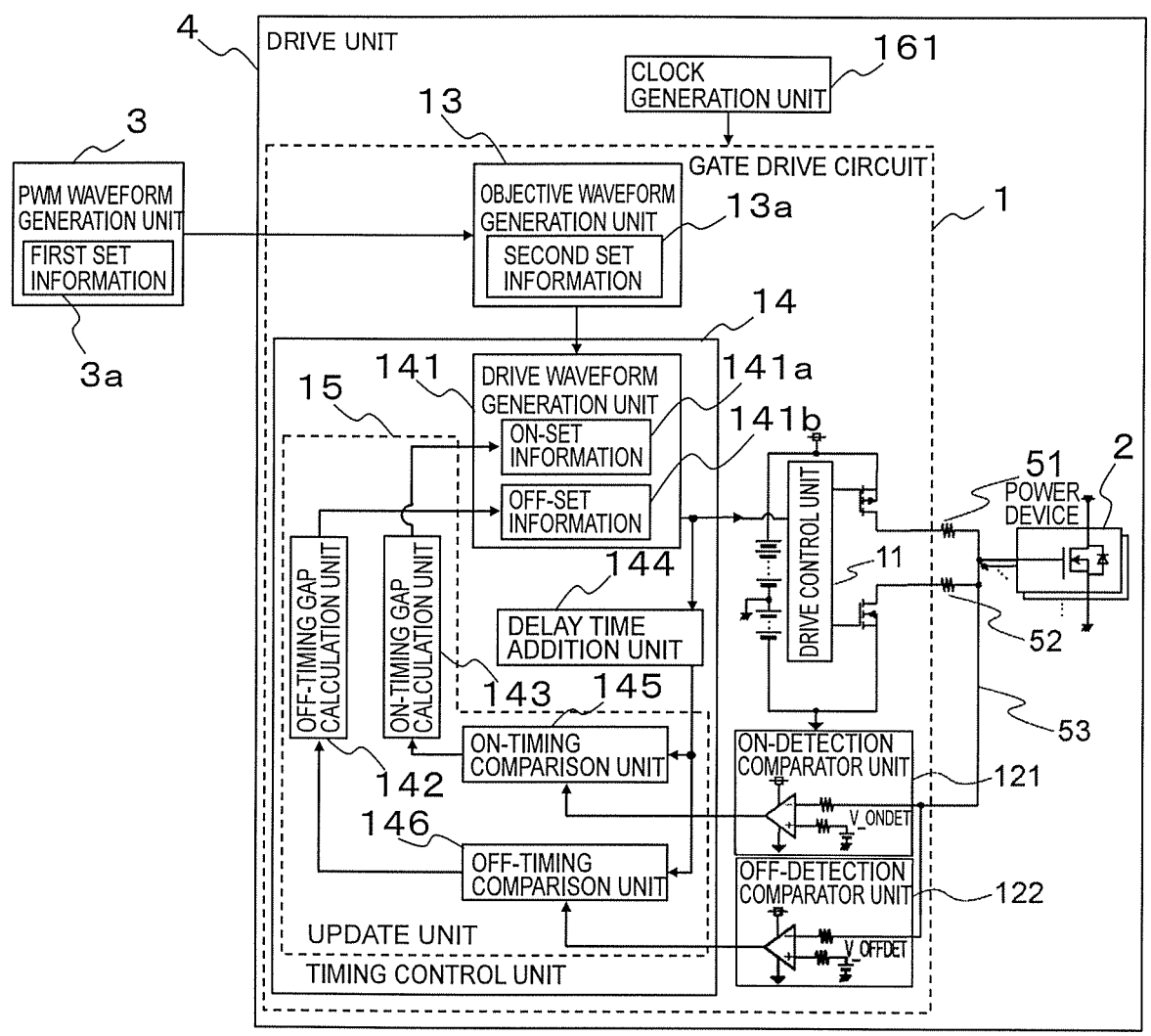
FIG. 9 is a diagram for illustrating an example of a configuration of a gate drive circuit according to a second embodiment of the present invention.

FIG. 9 is a diagram for illustrating an example of a configuration of a gate drive circuit according to a second embodiment of the present invention. In FIG. 9, there is only one drive unit 4 in which the gate drive circuit 1 is installed. One drive unit 4 drives a plurality of power devices 2 as in the first embodiment. The drive unit 4 drives only the power devices 2 that are used as the same arm of the same phase. A gate drive system accordingly includes a plurality of drive units 4 different from one another in terms of at least one of phase and arm. The description given here focuses on differences from the first embodiment. This applies to other embodiments as well.

In each of the plurality of drive units 4, the power devices 2 to be driven by the drive unit 4 are close to one another in characteristics, for example, the value of the threshold voltage Vth and the value of the transconductance gm. The on-side threshold voltage V_ONDET of the on-detection comparator unit 121 is, for example, an average value of actual measurement values of the threshold voltage Vth or the mirror section voltage VGP measured a plurality of times. Similarly, the off-side threshold voltage V_OFFDET of the off-detection comparator unit 122 is, for example, an average value of actual measurement values of the threshold voltage Vth or the mirror section voltage VGP measured a plurality of times. In the second embodiment, the objective waveform comparison unit 16 is installed in none of the drive units 4 because the power devices 2 of the same phase and the same arm are driven by only one drive unit 4. Also in the second embodiment, when the clock generation unit 161 generates a clock of 200 MHz, the dead time can be controlled with precision of several ten ns, and current unevenness can be reduced through the dead-time control.

Figure 10:
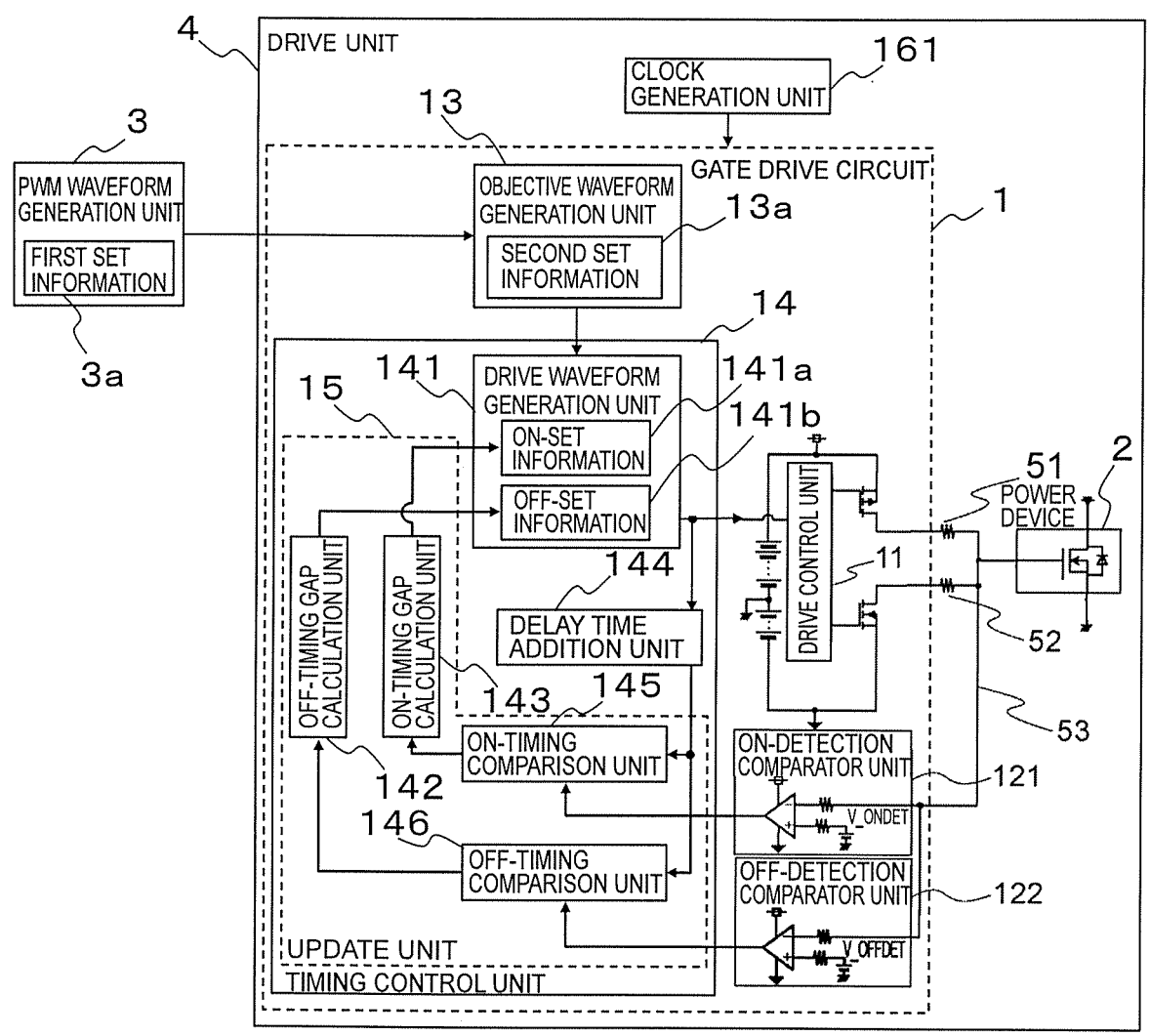
FIG. 10 is a diagram for illustrating an example of a configuration of a gate drive circuit according to a modification example of the second embodiment of the present invention.

As illustrated in FIG. 10, the number of power devices 2 to be driven by one drive unit 4 may be one.

Third Embodiment

Figure 11:
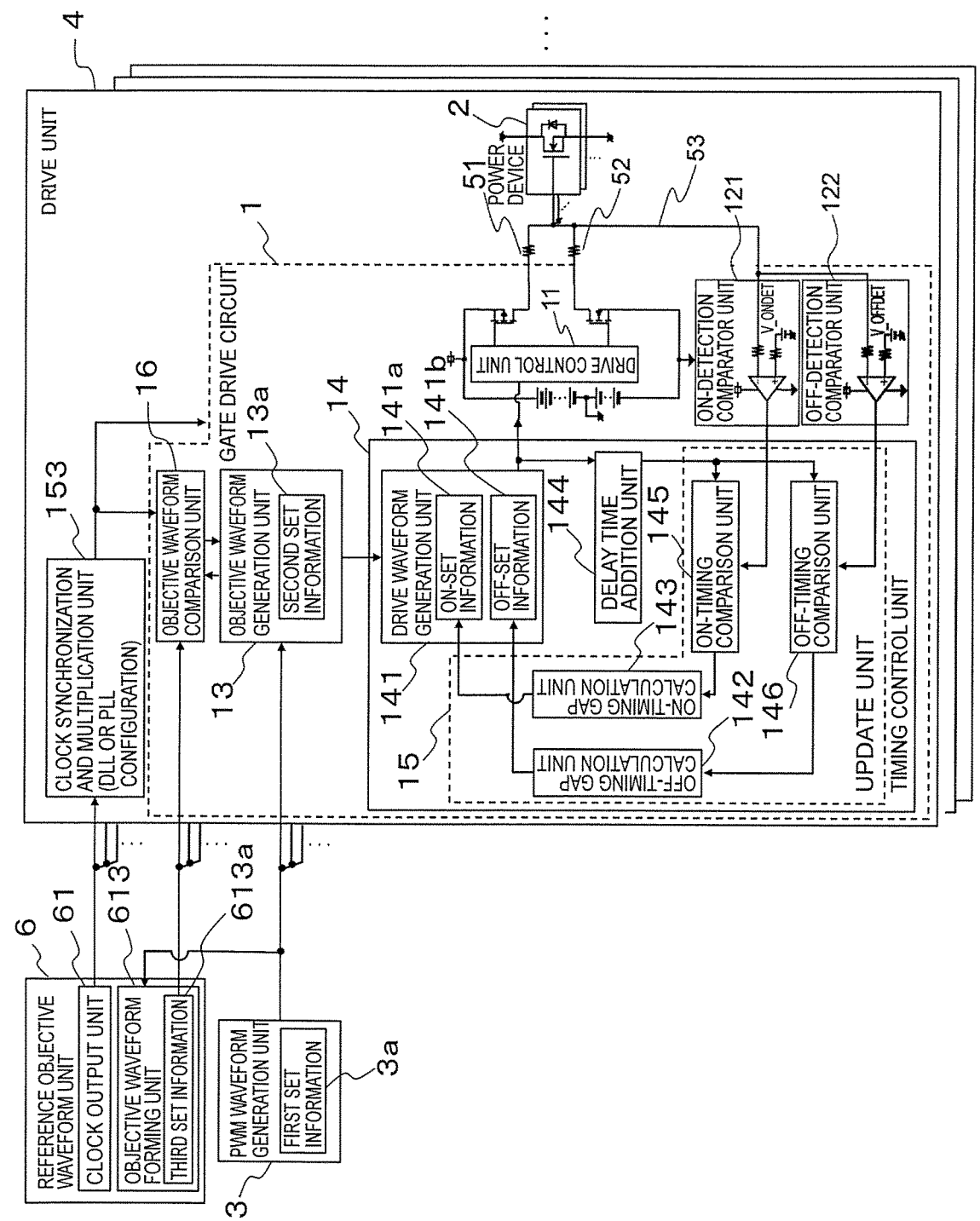
FIG. 11 is a diagram for illustrating an example of a configuration of agate drive system according to a third embodiment of the present invention.

FIG. 11 is a diagram for illustrating an example of a configuration of agate drive system according to a third embodiment of the present invention. In FIG. 11, only portions of the third embodiment that are relevant to the driving of the same arm of the same phase are illustrated as in the first embodiment.

In the third embodiment, a reference objective waveform unit 6 is provided separately from the drive unit 4 as illustrated in FIG. 11. The reference objective waveform unit 6 includes an objective waveform forming unit 613 and a clock output unit 61.

A drive PWM waveform signal output from the PWM waveform generation unit 3 is input to the objective waveform forming unit 613. The objective waveform forming unit 613 delays a PWM waveform indicated by the drive PWM waveform signal in accordance with third set information 613a, which indicates a set dead time, to form the drive PWM waveform signal into the shape of another PWM waveform signal. The PWM waveform signal generated by the shape forming is input to the objective waveform comparison unit 16 of each drive unit 4, as a signal indicating a reference objective waveform to be used as a reference. As in the first embodiment, the objective waveform comparison unit 16 may extract an on-period common to the power devices 2 to generate a PWM waveform that turns the power devices 2 on only in the extracted period.

The PWM signal input from the objective waveform forming unit 613 may be handled as an objective PWM waveform signal output from the objective waveform comparison unit 16. The objective waveform comparison unit 16 may therefore not be installed in each drive unit 4 when the reference objective waveform unit 6 is provided. The reference objective waveform unit 6 may be installed in one of the plurality of drive units 4 driving the power devices 2 that are connected in parallel.

The clock output unit 61 outputs a clock that serves as a reference to each drive unit 4. The output clock is input to a clock synchronization and multiplication unit 153, which is installed/placed in each drive unit 4. The clock synchronization and multiplication unit 153 multiplies the input clock a plurality of times, for example, and supplies the multiplied clock to the gate drive circuit 1. The clock generation unit 161 is therefore installed in none of the drive units 4 in the third embodiment. In the third embodiment, a clock output from the clock output unit 61 corresponds to a "first clock", and a clock output from the clock synchronization and multiplication unit 153 corresponds to a "second clock".

The operation timing of the drive units 4 can be aligned more closely by operating the drive units 4 based on an externally supplied clock. A gap of drive timing to drive the power devices 2 can therefore be reduced even more among the drive units 4. Current unevenness can be accordingly reduced even more.

The clock synchronization and multiplication unit 153 may be implemented by a circuit that uses known technologies called phase-locked loop (PLL) and delay-locked loop (DLL). It has been known that a combination of a PLL synchronization circuit or a DLL synchronization circuit and a frequency dividing circuit can be used to obtain a clock by appropriate multiplication or frequency division of the original clock by N/M times (N and M are each a natural number), and the combination is called a frequency synthesizer.

A further description is given with reference to FIG. 11. Wiring of equal length is used for a signal path from the PWM waveform generation unit 3 to each of the plurality of drive units 4, to thereby reduce delay fluctuations in the transmission of a drive PWM waveform signal indicating the PWM input waveform 501. Wiring of equal length is also used for a clock signal path from the clock output section 61 of the reference objective waveform unit 6 to the clock synchronization and multiplication unit 153 of each of the plurality of drive units 4 to distribute and transmit the clock. The clock synchronization and multiplication unit 153 in this case synchronizes, by PLL or DLL, the clock reduced in delay fluctuation, with the result that clock fluctuations among the plurality of drive units 4 are reduced to within a range of ±several ns. In addition, the clock from the clock synchronization and multiplication unit 153, which is reduced in delay fluctuation by wiring of equal length, is transmitted to the gate drive circuit 1, and an objective waveform signal is generated by the objective waveform generation unit 13 in each drive unit 4 with the clock that has no time gap. A gap of the objective waveform of the generated objective waveform signal among the plurality of drive units 4 can thus be reduced to within a range of ±several ns, which is the range of clock fluctuations.

The drive waveform generation unit 141 and the delay time addition unit 144 each add a delay time to generate the expected value waveform 504. When the drive control unit 11 executes control processing to match a waveform to the objective waveform 503, addition to or subtraction from the objective waveform 503 that has a gap of several ns among the plurality of drive units 4 is performed in units of one clock time width of a clock that has no time gap, so that the objective waveform 503 in one of the plurality of drive units 4 and the objective waveform 503 in another of the plurality of drive units become close to each other. As a result, in the driving of the power devices 2 by the drive control unit 11 to turn the power devices 2 on/off, the timing gap among the plurality of drive units 4 can be reduced to within a range of several ten ns for the first time.

Figure 12:
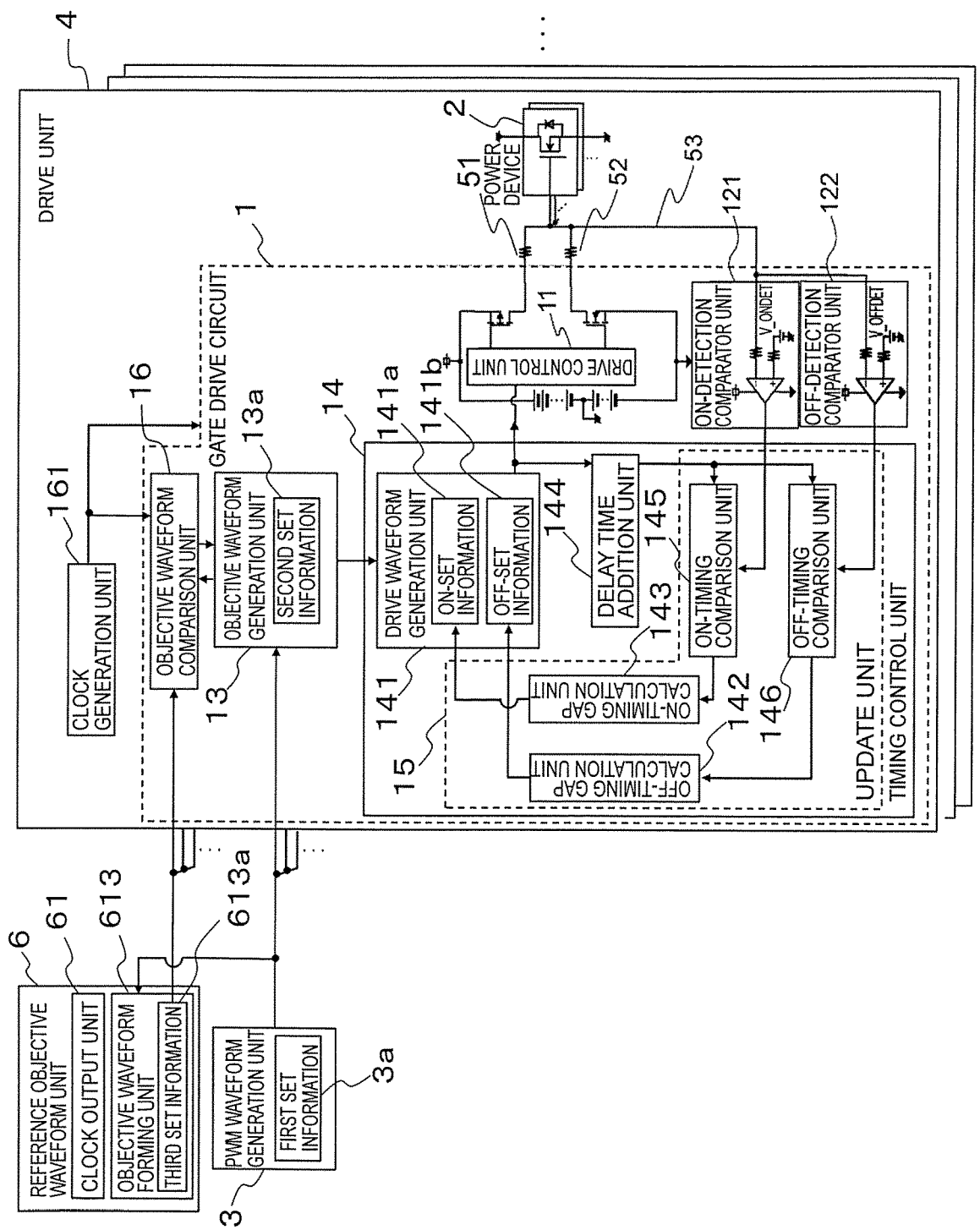
FIG. 12 is a diagram for illustrating an example of a configuration of a gate drive system according to a modification example of the third embodiment of the present invention.

Alternatively, as illustrated in FIG. 12, the clock generation unit 161 may be installed in each drive unit 4 instead of external clock supply to each drive unit 4.

Fourth Embodiment

Current unevenness is required to be reduced most when a maximum drain current IDmax flows. The drain current ID in a fourth embodiment of the present invention is therefore assumed to be the maximum drain current IDmax.

A value taken by the mirror section voltage VGP when the maximum drain current IDmax flows is obtained by substituting ID in Expression (2) with IDmax. A voltage observed when the mirror section actually ends in the turning on is a voltage that is obtained by adding a minute offset to the mirror section voltage VGP, which can be confirmed by actual measurement or by circuit simulation of simulation program with integrated circuit emphasis (SPICE), for example. This voltage is represented by V_GP_on, and is expressed as V_GP_on=VGP+on-constant. In the fourth embodiment, the voltage V_GP_on is set to the on-side threshold voltage V_ONDET. Timing at which the mirror section ends in the turning on can accordingly be detected with high precision. The polarity of a signal output from the on-detection comparator unit 121 changes from positive to negative as the gate voltage Vgs exceeds the on-side threshold voltage V_ONDET.

Similarly, a voltage observed when the mirror section actually ends in the turning off is a voltage that is obtained by adding a minute offset to the mirror section voltage VGP. This voltage is represented by V_GP_off, and is expressed as V_GP_off=VGP+off-constant. In the fourth embodiment, the voltage V_GP_off is set to the off-side threshold voltage V_OFFDET. Timing at which the mirror section ends in the turning off can accordingly be detected with high precision. The polarity of a signal output from the off-detection comparator unit 122 changes from negative to positive as the gate voltage Vgs drops lower than the off-side threshold voltage V_OFFDET.

The identification of the state of the power devices 2 with a higher precision can be expected by thus setting the voltage V_GP_on and the voltage V_GP_off as the on-side threshold voltage V_ONDET and the off-side threshold voltage V_OFFDET, respectively. The on-set information 141a and the off-set information 141b can therefore be updated more appropriately. As a result, current unevenness is reduced more appropriately in a manner suitable for the maximum drain current IDmax. That is, even when there is current unevenness, the drain current ID that is largest among the power devices 2 connected in parallel is reduced to a smaller magnitude. The shortening of the life of the power devices 2 due to current unevenness is accordingly reduced more.

Fifth Embodiment

Figure 13:
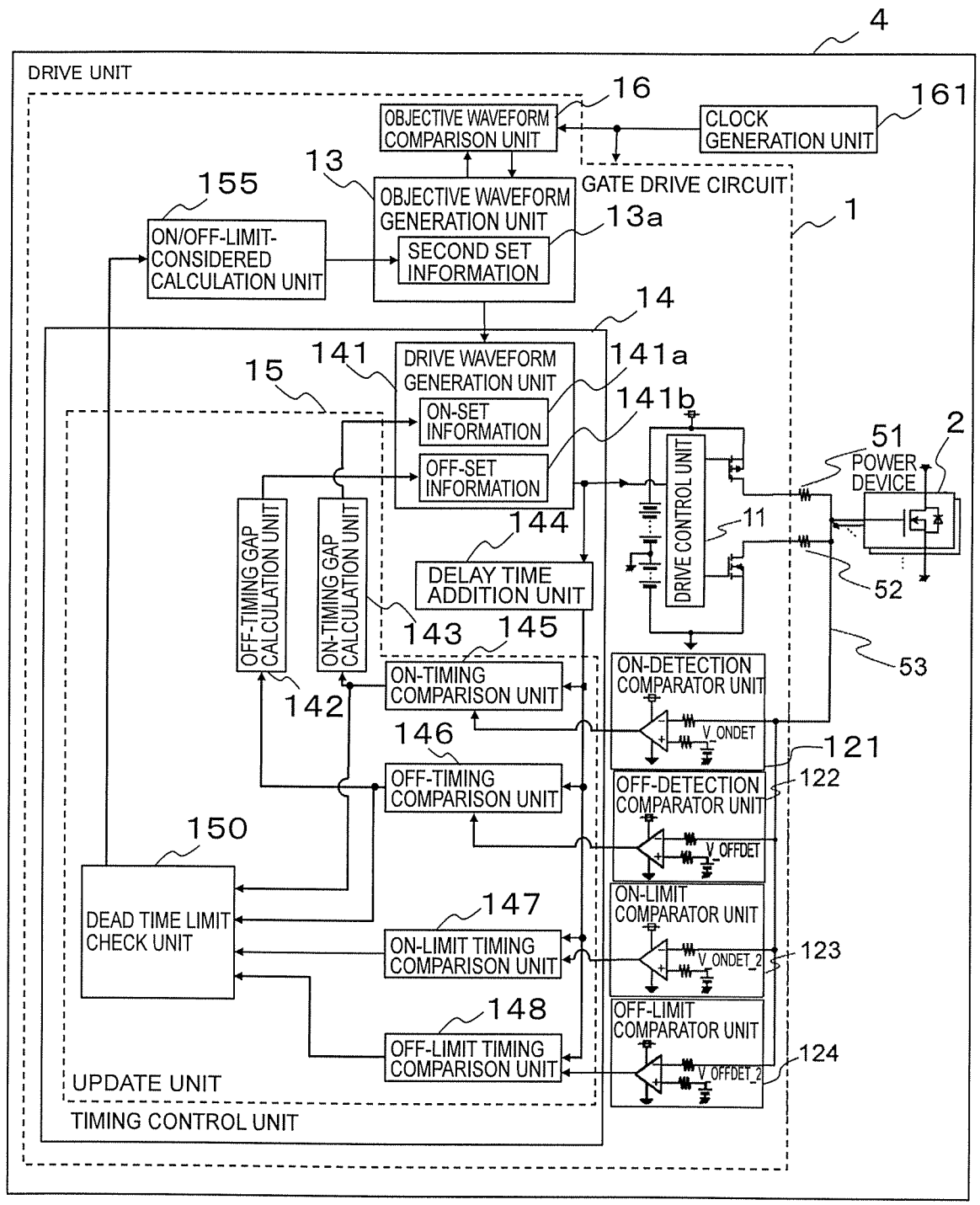
FIG. 13 is a diagram for illustrating an example of a configuration of a gate drive circuit according to a fifth embodiment of the present invention.

FIG. 13 is a diagram for illustrating an example of a configuration of a gate drive circuit according to a fifth embodiment of the present invention. In FIG. 13, similarly to FIG. 9, there is only one drive unit 4 in which the gate drive circuit 1 is installed. However, there is at least one other drive unit 4 that drives the power devices 2 of the same phase and the same arm. The drive unit 4 therefore includes the objective waveform comparison unit 16.

In the fifth embodiment, an on-limit timing comparison unit 147, an off-limit timing comparison unit 148, a dead time limit check unit 150, and an on/off-limit-considered calculation unit 155 are added to the update unit 15 of the drive unit 4. An on-limit comparator unit 123 and an off-limit comparator unit 124 are added as well. The on-limit comparator unit 123 and the off-limit comparator unit 124 have a configuration basically the same as that of the on-detection comparator unit 121. The on-limit comparator unit 123 and the off-limit comparator unit 124 correspond to the state detection unit as well.

The on-limit comparator unit 123 compares the gate voltage Vgs to an on-side limit threshold voltage V_ON-DET_2, and outputs the result of the comparison. The polarity of the output signal is negative when the gate voltage Vgs is higher than the on-side limit threshold voltage V_ONDET_2, and is positive when the gate voltage Vgs is lower than the on-side limit threshold voltage V_ONDET_2. In the fifth embodiment, the on-side limit threshold voltage V_ONDET_2 is set to the threshold voltage Vth.

Meanwhile, the off-limit comparator unit 124 compares the gate voltage Vgs to an off-side limit threshold voltage V_OFFDET_2, and outputs the result of the comparison. The polarity of the output signal is negative when the gate voltage Vgs is higher than the off-side limit threshold voltage V_OFFDET_2, and is positive when the gate voltage Vgs is lower than the off-side limit threshold voltage V_OFFDET_2. In the fifth embodiment, the off-side limit threshold voltage V_OFFDET_2 is set to the threshold voltage Vth as well.

Figure 14:
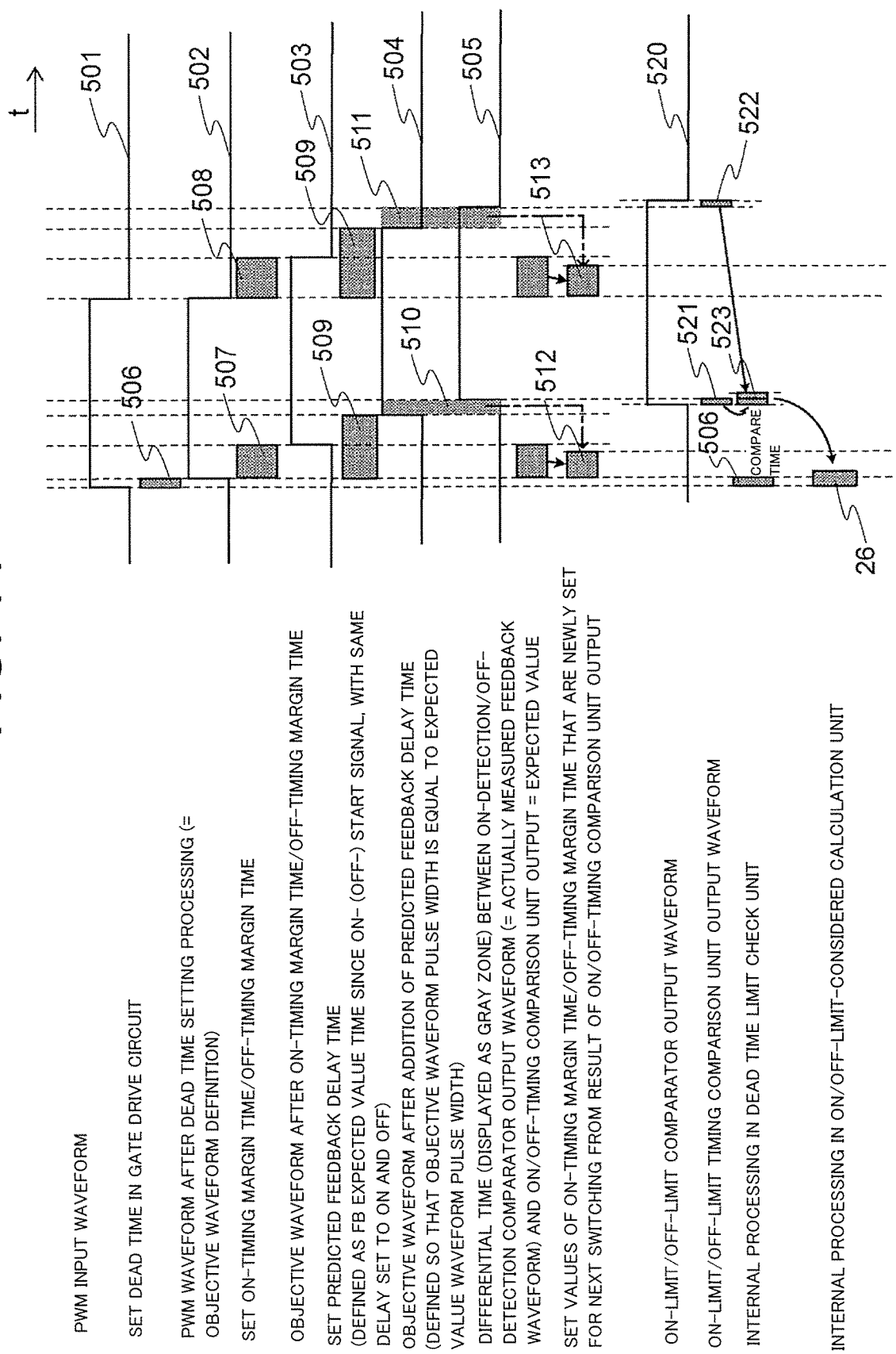
FIG. 14 is a timing chart for showing an example of the operation of parts of a drive unit in which the gate drive circuit according to the fifth embodiment of the present invention is installed.

FIG. 14 is a timing chart for showing an example of the operation of parts of a drive unit in which the gate drive circuit according to the fifth embodiment of the present invention is installed. The operation of the drive unit 4 is described in detail below with additional reference to FIG. 14.

As described above, timing at which the gate voltage Vgs exceeds the threshold voltage Vth is detected by the on-limit comparator unit 123, and timing at which the gate voltage Vgs drops lower than the threshold voltage Vth is detected by the off-limit comparator unit 124. An output waveform 520 illustrated in FIG. 14 is identified from the detected timing.

The output signal from the on-limit comparator unit 123 is input to the on-limit timing comparison unit 147. On-timing information indicating timing at which the expected value waveform 504 starts rising is input to the on-limit timing comparison unit 147 from the delay time addition unit 144. The on-limit timing comparison unit 147 compares the rise start timing and timing at which the gate voltage Vgs exceeds the threshold voltage Vth, identifies a differential time that is a time lag between the former and the latter, and notifies the identified differential time to the dead time limit check unit 150. In FIG. 14, this differential time is represented by a quadrangle 521.

The output signal from the off-limit comparator unit 124 is input to the off-limit timing comparison unit 148. Off-timing information indicating timing at which the expected value waveform 504 completes rising is input to the off-limit timing comparison unit 148 from the delay time addition unit 144. The off-limit timing comparison unit 148 compares the rise completion timing and timing at which the gate voltage Vgs drops lower than the threshold voltage Vth, identifies a differential time that is a time lag between the former and the latter, and notifies the identified differential time to the dead time limit check unit 150. In FIG. 14, this differential time is represented by a quadrangle 522.

The fifth embodiment is directed to shortening the dead time while reducing current unevenness among the power devices 2. The dead time limit check unit 150 and the on/off-limit-considered calculation unit 155 are components for accomplishing the shortening of the dead time. A specific description is given on a method of shortening the dead time. A configuration assumed here has two power devices 2: one that forms the upper arm of a half bridge, namely, the high (H) side, and one that forms the lower arm of the half bridge, namely, the low (L) side.

As described above, an actual dead time is controlled with the on-set information 141*a* and the off-set information 141*b*. This dead time is based on a dead time managed with the second set information 13*a*. In the fifth embodiment, control is performed through matching with the dead time that serves as a base. The dead time control is executed in each drive unit 4. This accomplishes optimization of the dead time that serves as a base, while reducing a gap among waveforms that are generated as the objective waveform 503 in the drive units 4. To avoid confusion, a dead time specified by the second set information 13*a* is hereinafter referred to as "objective dead time" for distinction. This objective dead time is a time represented by the quadrangle 506 in FIG. 14. The objective dead time is therefore also referred to as "time 506".

A time at which Vgs=Vth is established is timing at which the drain current Ids starts flowing, or stops flowing. From this, relationships given below are required to be satisfied in order to prevent a flow of an arm short-circuit current in the half bridge.

$$\text{Objective dead time} \geq H\text{-side } t6 + L\text{-side}(t2+t3) \qquad (9)$$

$$\text{Objective dead time} \geq L\text{-side } t6 + H\text{-side}(t2+t3) \qquad (10)$$

The on-side threshold voltage V_ONDET and the off-side threshold voltage V_OFFDET are both assumed to be the mirror section voltage VGP, timing at which the gate voltage Vgs exceeds the on-side threshold voltage V_ONDET is defined as tim_VON1, and timing at which the gate voltage Vgs exceeds the on-side limit threshold voltage V_ONDET_2 is defined as tim_VON2. Timing at which the gate voltage Vgs drops lower than the off-side threshold voltage V_OFFDET is defined as tim_VOFF1, and timing at which the gate voltage Vgs drops lower than the off-side limit threshold voltage V_OFFDET_2 is defined as tim_VOFF2.

When the timing is defined as described above, relationships given below are established.

$$|tim\_VON2 - tim\_VON1| = t2 + t3 \qquad (11)$$

$$|tim\_VOFF2 - tim\_VOFF1| = t6 \qquad (12)$$

In FIG. 14, the quadrangle 521 represents a time calculated by Expression (11), and the quadrangle 522 represents a time calculated by Expression (12). A quadrangle 523 represents a total time that is the sum of the time 521 and the time 522. |tim_VON2−tim_VON1| and |tim_VOFF2−tim_VOFF1| correspond to the first time and the second time, respectively, in the fifth embodiment.

An expression given below is obtained from Expressions (11) and (12).

$$t2 + t3 + t6 = |tim\_VON2 - tim\_VON1| + |tim\_VOFF2 - tim\_VOFF1| \qquad (13)$$

Note here that t2, t3, and t6 in Expression (13) are those in the power devices 2 that are driven by the same drive unit 4, namely, the power devices 2 that form one of the arms.

Transition times in Expression (13) are originally required to be transition times of the own phase and a complementary phase, namely, transition times in the H-side power device 2 and the L-side power device 2, as in Expression (9) and Expression (10). The transition times on the H side and the L side, however, can be calculated from Expressions (3) to (8). For that reason, in the fifth embodiment, the longer one of the time (H-side t6+L-side t2+t3) and the time (L-side t6+H-side t2+t3) is selected, and a time a little longer than the selected time is set as the objective dead time. The little longer time may be, for example, a unit time set in advance for an update, or a time that reflects a change brought to the selected time.

In Expressions (4), (5), and (8) for calculating t2, t3, and t6, values other than the drain current ID are fixed values. When the maximum gate voltage VGA is within a normal range in normal driving, the transition times change toward a direction in which t2, t3, and t6 all become longer as the value of the drain current ID increases. Here, the transition time t2 on the H side is represented by t2_high and the transition time t2 on the L side is represented by t2_low. The transition times t3 and t6 are both longer on the L side when a relationship t2_high<t2_low is satisfied. When the relationship is not satisfied, the transition times t2, t3, and t6 are all longer on the H side.

The transition times t2, t3, and t6 of the own phase are represented by t21, t31, and t61, respectively. The transition times t2, t3, and t6 of the complementary phase are represented by t22, t32, and t62, respectively. When a relationship t21<t22 is established between the transition times of the own phase and the complementary phase, relationships given below are established.

$$t21+t31+t61 < t21+t31+t62 < t22+t32+t62 \text{ and}$$

$$t21+t31+t61 < t22+t32+t61 < t22+t32+t62 \quad (14)$$

When a relationship t21>t22 is established, relationships expressed by a modification of Expression (14) in which the inequality signs are reversed are established.

An arm short circuit is accordingly avoidable by keeping the sum of the transition times of the own phase, t2+t3+t6, to a value equal to or less than the objective dead time in both of the two phases, the own phase and the complementary phase. In other words, the lower limit of the objective dead time is limited by t2+t3+t6. In the fifth embodiment, at least one of the on-set information 141a and the off-set information 141b is therefore updated in a manner that prevents an expression given below from being satisfied. When the relationship t21>t22 is established, a relationship t31>t32 and a relationship t61>t62 are both established as well.

$$|tim\_VON2-tim\_Von1|+|tim\_VOFF2-tim\_VOFF11=t2+t3+t6 < \text{object ive dead time} \quad (15)$$

The left side of Expression (15) is the total time of the first time and the second time.

The dead time limit check unit 150 determines whether Expression (15) is satisfied. For that determination, the dead time limit check unit 150 obtains information indicating tim_VON1 from the on-timing comparison unit 145, and obtains information indicating tim_VOFF1 from the off-timing comparison unit 146. The dead time limit check unit 150 also obtains information indicating tim_VON2 and information indicating tim_VOFF2 from the on-limit timing comparison unit 147 and the off-limit timing comparison unit 148, respectively.

The dead time limit check unit 150 compares the total time 523 of the time 521, which is t2+t3, and the time 522, which is t6, to the dead time 506 set in the second set information 13a. The dead time limit check unit 150 causes the on/off-limit-considered calculation unit 155 to execute processing described below, depending on the result of the comparison.

When it is determined as a result of the comparison that the time 506 is equal to or more than the time 523, the dead time limit check unit 150 causes the on/off-limit-considered calculation unit 155 to execute no processing. When it is determined as a result of the comparison that the time 506 is less than the time 523, on the other hand, the dead time limit check unit 150 outputs information indicating the time 523 to the on/off-limit-considered calculation unit 155, to thereby cause the on/off-limit-considered calculation unit 155 to update the second set information 13a, with the output information as new second set information 13a. The time 523 is set as a new dead time 506 by the update.

Alternatively, the dead time limit check unit 150 may cause the on/off-limit-considered calculation unit 155 to execute processing described below, depending on the result of the comparison.

When it is determined as a result of the comparison that the time 506 is less than the time 523, the dead time limit check unit 150 outputs information indicating the time 523 to the on/off-limit-considered calculation unit 155 to update the second set information 13a with the output information. When it is determined as a result of the comparison that the time 506 is equal to the time 523, the dead time limit check unit 150 causes the on/off-limit-considered calculation unit 155 to execute no processing. When it is determined as a result of the comparison that the time 506 is more than the time 523, the dead time limit check unit 150 counts the number of times this magnitude relationship has lasted. On the condition that the counted number of times be equal to or more than a value set in advance, the dead time limit check unit 150 calculates a time shorter than the time 506, and outputs the calculated time to the on/off-limit-considered calculation unit 155. The output time is stored as new second set information 13a by the on/off-limit-considered calculation unit 155. The calculated time may be shorter by, for example, a unit time set in advance, or by a time that reflects the difference between the time 506 and the time 523.

The quadrangle 526 illustrated in FIG. 14 represents a dead time newly set in place of the dead time 506. Here, the dead time 506 is determined as short, and the dead time 526 is therefore longer than the dead time 506.

In the fifth embodiment, the driving of the power devices 2 with a minimum dead time is accomplished by appropriately setting the objective dead time of Expression (15). However, further update of the time 506, namely, the dead time, by the on/off-limit-considered calculation unit 155 based on determination that uses Expression (15) is preferred to be at a pace slower than the update of margin times by the on-timing gap calculation unit 142 and the off-timing gap calculation unit 143, so that the power devices 2 are driven stably.

The update of margin times, in other words, the on-set information 141a and the off-set information 141b, changes the actual dead time, and a dead time set with the second set information 13a may therefore be a relatively long time. The dead time set with the second set information 13a may be changed by referring to pieces of information that are held as the on-set information 141a and the off-set information 141b after the driving of the power devices 2 is repeated.

Each gate drive circuit 1 keeps track of a time lag from a common objective waveform for each switching action, and may determine whether the dead time is to be set long or short based on whether an arm short circuit has been detected, in place of or in combination of the determination that uses Expression (15), by detecting an arm short circuit through, for example, periodic comparison of time lags from the objective waveform between complementary phases, or through other methods. In this case, even when an initially set objective dead time is inadequate, the driving of the power devices 2 with a minimum dead time under the current use environment is accomplished.

In the related art described in Japanese Patent No. 6,337,803, a voltage change of a drain voltage Vds is detected based on whether a body diode is energized by changing the connection of a source of a sensing MOSFET that is originally provided to sense a drain current. According to this related art, it is required to add a connection switching circuit, which uses transistors to switch to the drain side and source side of the sensing MOSFET, and a resistor element for generating a voltage during energization.

The related art is structured to determine whether a MOSFET is turned on or off by detecting a voltage change of an overall drain current Vds of main MOSFETs. For that reason, even when pairs of a driver and a main MOSFET are connected in parallel, MOSFETs that receive dead time control are a main MOSFET that is turned on the earliest and a main MOSFET that is turned off the latest out of the main MOSFETs connected in parallel. A timing gap in the turning on and a timing gap in the turning off work to prolong the length of the dead time because the turning on is required to wait for a drop of the overall drain voltage Vds of the parallel connection. This means that the dead time in parallel connection operation is required to be set longer depending on fluctuations in the characteristics of main MOSFETs connected in parallel.

What is claimed is:

1. A gate drive circuit, comprising:
    an objective waveform generation unit configured to generate an objective waveform to which a dead time indicated by preset dead time information is added, so as to perform on/off driving of one or more power devices;
    a drive waveform generation unit configured to generate, from the objective waveform, a drive waveform for driving the one or more power devices, by referring to on-timing set information and off-timing set information, the on-timing set information indicating a first change amount of timing at which the one or more power devices are to be turned on with the objective waveform as a reference, the off-timing set information indicating a second change amount of timing at which the one or more power devices are to be turned off with the objective waveform as a reference;
    a drive control unit configured to perform on/off driving of the one or more power devices by changing a voltage to be applied to a gate of each of the one or more power devices, based on the drive waveform;
    a state detection unit configured to detect a state of the one or more power devices, based on a gate voltage of each of the one or more power devices;
    a predicted waveform generation unit configured to generate a predicted waveform of the voltage to be applied by the drive control unit to the one or more power devices, based on the drive waveform; and
    an update unit configured to update the on-timing set information and the off-timing set information, based on a result of the state detection by the state detection unit and a result of comparison to the predicted waveform.

2. The gate drive circuit according to claim 1, further comprising an objective waveform comparison unit configured to change the objective waveform that is generated by the objective waveform generation unit, by comparing the objective waveform that is generated by another gate drive circuit, which drives one or more of other power devices connected in parallel to the one or more power devices to turn the one or more other power devices on/off, to the objective waveform that is generated by the objective waveform generation unit.

3. The gate drive circuit according to claim 1, wherein the state detection unit is configured to detect the state of the one or more power devices by comparing the gate voltage to at least one of a threshold voltage of the one or more power devices or a mirror section voltage.

4. The gate drive circuit according to claim 1, wherein the state detection unit is configured to detect, as the state of the one or more power devices, an end of a mirror section by comparing the gate voltage to a voltage higher than a mirror section voltage of the one or more power devices.

5. The gate drive circuit according to claim 1, wherein the update unit is configured to update the on-timing set information and the off-timing set information so that a pulse width of the drive waveform is equal to a pulse width of the objective waveform.

6. The gate drive circuit according to claim 1, wherein the predicted waveform generation unit is configured to generate the predicted waveform by adding the same amount of delay to on-timing and off-timing in the drive waveform.

7. The gate drive circuit according to claim 1,
    wherein the state detection unit is configured to compare the gate voltage to the threshold voltage of the one or more power devices, and to the mirror section voltage,
    wherein the update unit is configured to calculate, by using a result of the detection by the state detection unit, a first time, which starts when the gate voltage exceeds the threshold voltage and which ends when the gate voltage exceeds the mirror section voltage when the one or more power devices is turned on, and a second time, which starts when the gate voltage drops below the mirror section voltage and which ends when the gate voltage drops below the threshold voltage when the one or more power devices is turned off, and is configured to update the dead time information based on the first time and the second time.

8. The gate drive circuit according to claim 7, wherein the update unit is configured to update the dead time information so that a total time obtained by adding the second time to the first time is prevented from being shorter than a lower-limit dead time.

9. A gate drive system, comprising a plurality of the gate drive circuits of claim 1,
    the plurality of the gate drive circuits each driving one or more of power devices connected in parallel to turn the one or more of the power device on/off.

10. The gate drive system according to claim 9, further comprising an objective waveform forming unit configured to generate a reference objective waveform to be used as a reference in the plurality of gate drive circuits, by comparing objective waveforms each of which is generated by the objective waveform generation unit included in each of the plurality of gate drive circuits.

11. The gate drive system according to claim 9, further comprising a clock output unit configured to supply a first clock to the plurality of gate drive circuits through wiring of equal length,
  wherein, on a side of the plurality of gate drive circuits, a clock synchronization and multiplication unit configured to supply a second clock to the plurality of gate drive circuits is placed, the second clock being generated through synchronization and multiplication of the supplied first clock, and
  wherein the plurality of gate drive circuits are supplied with the second clock from the clock synchronization and multiplication unit through wiring of equal length.

* * * * *